(12) United States Patent
Abhijeet et al.

(10) Patent No.: US 10,523,241 B2
(45) Date of Patent: Dec. 31, 2019

(54) OBJECT FAN OUT WRITE OPERATION

(71) Applicant: International Business Machines Corporation, Armonk, NY (US)

(72) Inventors: Kumar Abhijeet, Chicago, IL (US); Andrew D. Baptist, Mt. Pleasant, WI (US); S. Christopher Gladwin, Chicago, IL (US); Jason K. Resch, Chicago, IL (US)

(73) Assignee: PURE STORAGE, INC., Mountain View, CA (US)

( * ) Notice: Subject to any disclaimer, the term of this patent is extended or adjusted under 35 U.S.C. 154(b) by 314 days.

(21) Appl. No.: 15/445,033

(22) Filed: Feb. 28, 2017

(65) Prior Publication Data
US 2017/0168719 A1    Jun. 15, 2017

Related U.S. Application Data

(63) Continuation-in-part of application No. 15/075,946, filed on Mar. 21, 2016, now Pat. No. 10,169,125.
(Continued)

(51) Int. Cl.
*G06F 11/10* (2006.01)
*H03M 13/15* (2006.01)
(Continued)

(52) U.S. Cl.
CPC ........ *H03M 13/1515* (2013.01); *G06F 3/064* (2013.01); *G06F 3/067* (2013.01);
(Continued)

(58) Field of Classification Search
CPC ..... G06F 2211/1028; G06F 2211/1023; G06F 2211/1026; G06F 17/30575; G06F 17/30578
See application file for complete search history.

(56) References Cited

U.S. PATENT DOCUMENTS 4,092,732 A    5/1978 Ouchi
5,454,101 A    9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Joseph O Schell
(74) *Attorney, Agent, or Firm* — Garlick & Markison; Shayne X. Short

(57) ABSTRACT

A computing device includes an interface configured to interface and communicate with a dispersed storage network (DSN), a memory that stores operational instructions, and a processing module operably coupled to the interface and memory such that the processing module, when operable within the computing device based on the operational instructions, is configured to perform various operations. The computing device receives a request to store a data object and to dispersed error encode the data object to generate a plurality of sets of encoded data slices (EDSs). The computing device then performs a deterministic function on a data object name to generate a plurality of data object names. The computing device then replicates the plurality of sets of EDSs to generate other pluralities of sets of EDSs and to facilitate storage of the plurality of sets of EDSs and the other pluralities of sets of EDSs within a plurality of storage units (SUs).

20 Claims, 6 Drawing Sheets

Related U.S. Application Data

(60) Provisional application No. 62/168,114, filed on May 29, 2015.

(51) Int. Cl.
*G06F 3/06* (2006.01)
*H03M 13/00* (2006.01)

(52) U.S. Cl.
CPC ........ *G06F 3/0619* (2013.01); *G06F 11/1076* (2013.01); *H03M 13/616* (2013.01)

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2003/0172089 A1* | 9/2003 | Douceur ............. G06F 16/10 |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma et al. |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula, Jr. |
| 2005/0132070 A1 | 6/2005 | Redlich et al. |
| 2005/0144382 A1 | 6/2005 | Schmisseur |
| 2005/0229069 A1 | 10/2005 | Hassner |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll, Jr. |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters, III et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2011/0196664 A1* | 8/2011 | Zunger ............... H04L 67/1095 703/21 |
| 2012/0084383 A1* | 4/2012 | Bernbo ............... H04L 12/1845 709/213 |
| 2012/0110390 A1* | 5/2012 | Grube .................. G06F 16/972 714/47.2 |
| 2013/0086442 A1* | 4/2013 | Baptist ............... G06F 11/1076 714/752 |
| 2013/0111293 A1* | 5/2013 | Gladwin ............. G06F 11/1076 714/752 |
| 2013/0304745 A1* | 11/2013 | Dhuse ................. G06F 16/2272 707/741 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

(56) References Cited

OTHER PUBLICATIONS

Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

* cited by examiner

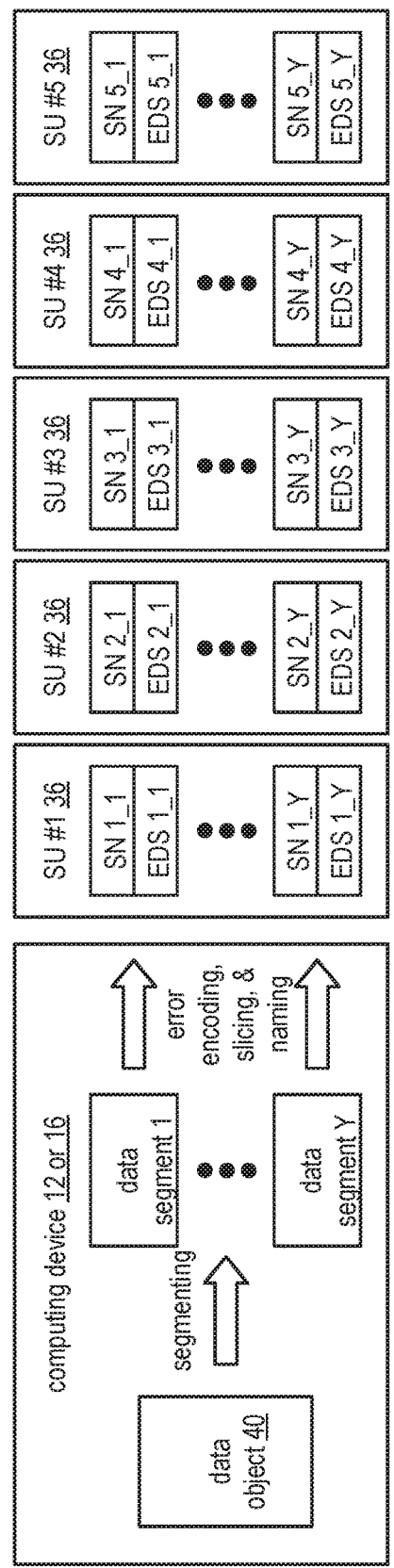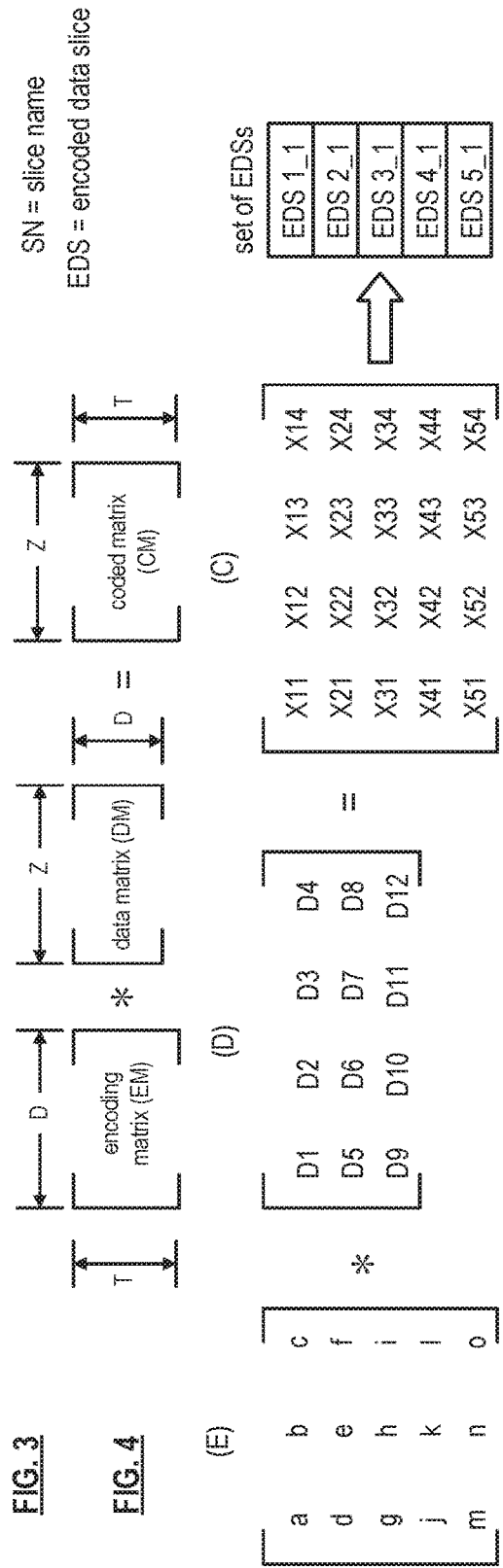

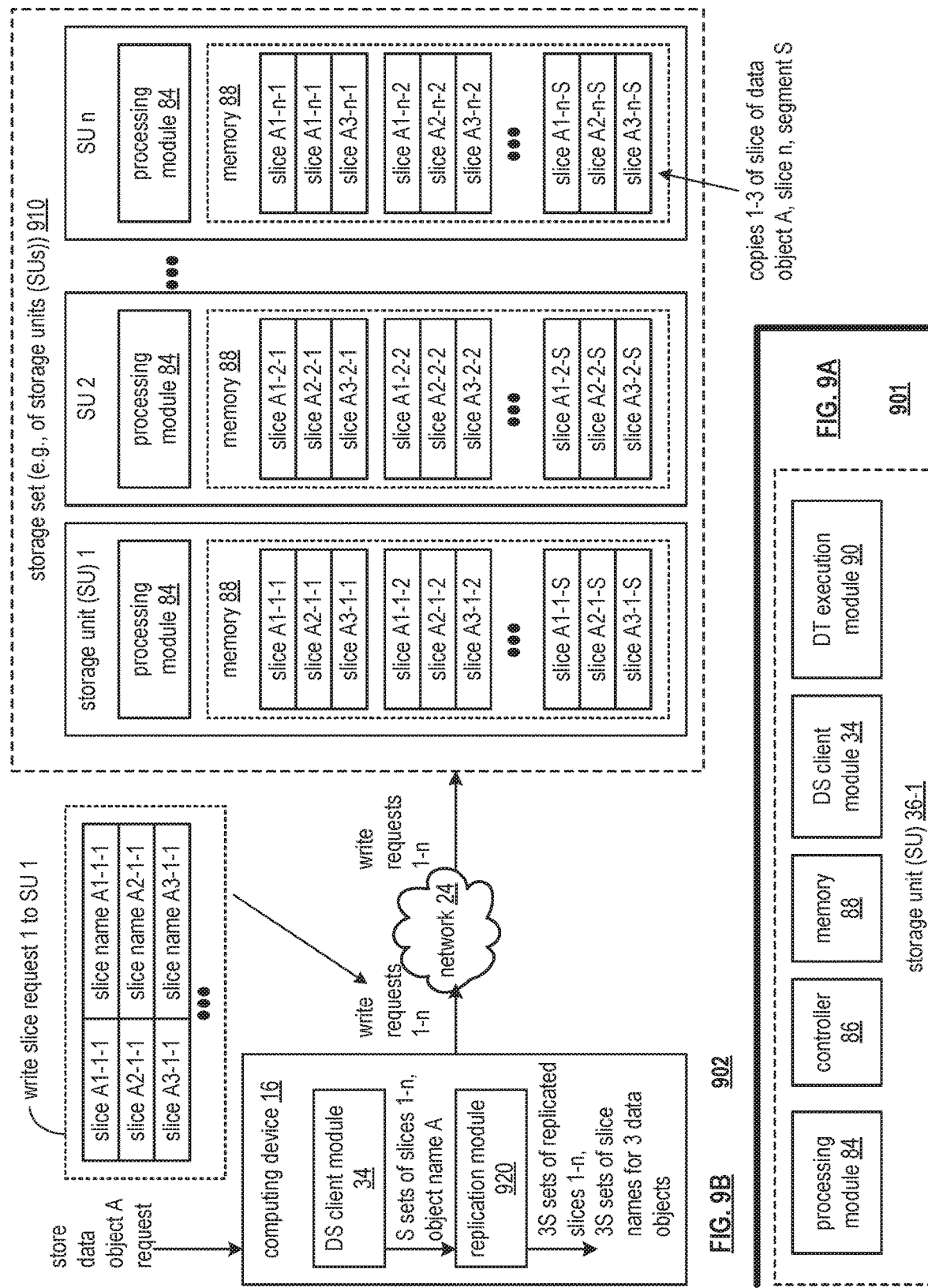

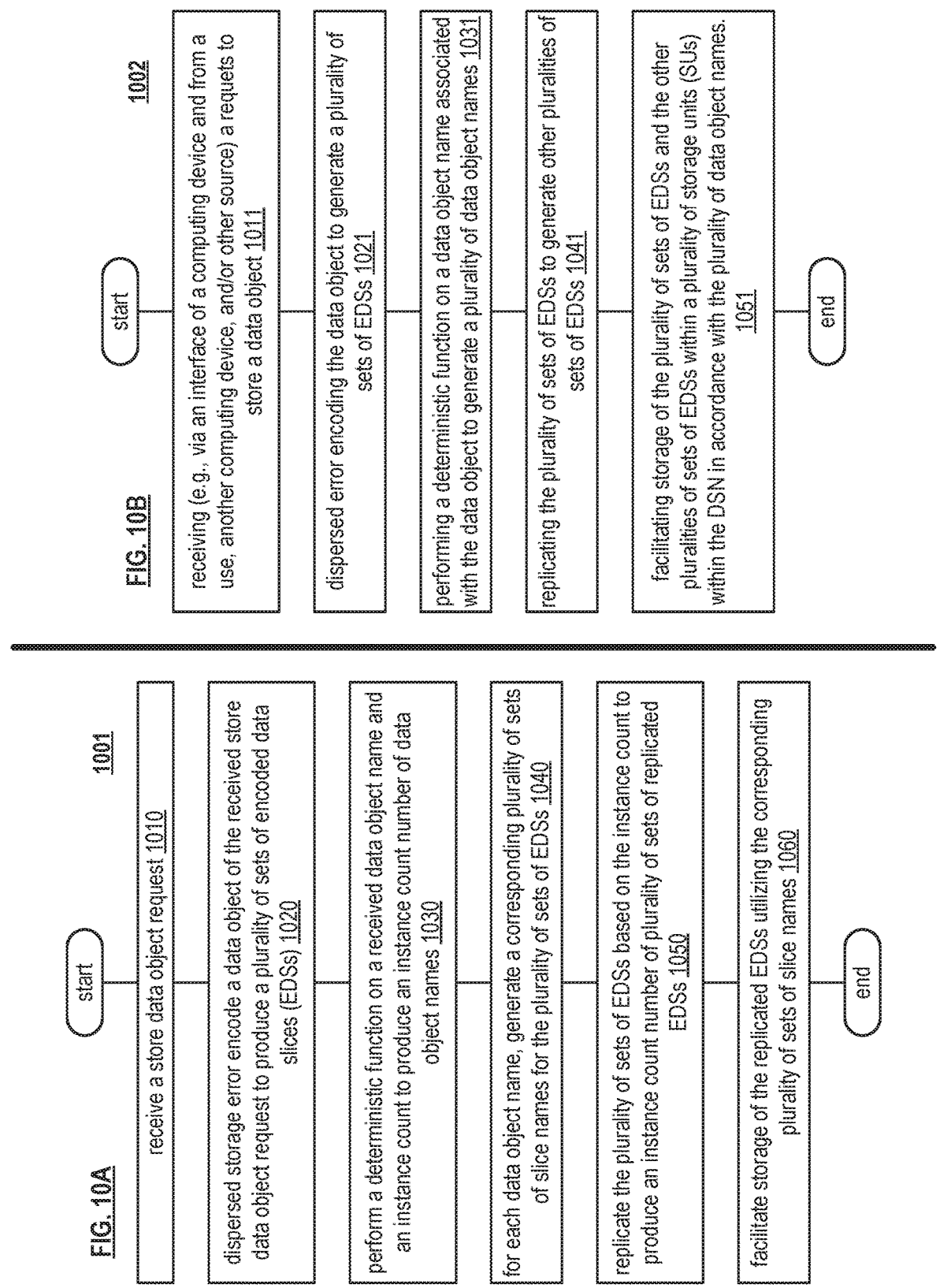

OBJECT FAN OUT WRITE OPERATION

CROSS REFERENCE TO RELATED PATENTS

The present U.S. Utility Patent Application also claims priority pursuant to 35 U.S.C. § 120, as a continuation-in-part (CIP) of U.S. Utility patent application Ser. No. 15/075,946, entitled "RE-ENCODING DATA IN A DISPERSED STORAGE NETWORK," filed Mar. 21, 2016, which claims priority pursuant to 35 U.S.C. § 119(e) to U.S. Provisional Application No. 62/168,114, entitled "RE-ENCODING DATA IN A DISPERSED STORAGE NETWORK," filed May 29, 2015, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Within data storage systems, there may be instances where more than one user seeks to access a particular portion of data. In some instances of such data storage systems, the system resources may not adequately be able to service all of the requests for the same data. The prior art does not provide adequate acceptable solutions to service such needs and in such situations. There continues to a need in the prior art for improvement in the operation of data storage systems.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 9A is a diagram of an example of a storage unit (SU) within the distributed computing system performing a distributed storage and task processing operation;

FIG. 9B is a schematic block diagram of another embodiment of a distributed computing system in accordance with the present invention;

FIG. 10A is a flowchart illustrating another example of redundantly storing data in accordance with the present invention; and FIG. 10B is a diagram illustrating an embodiment of a method for execution by one or more computing devices in accordance with the present invention.

DETAILED DESCRIPTION OF THE INVENTION

Figure 1:
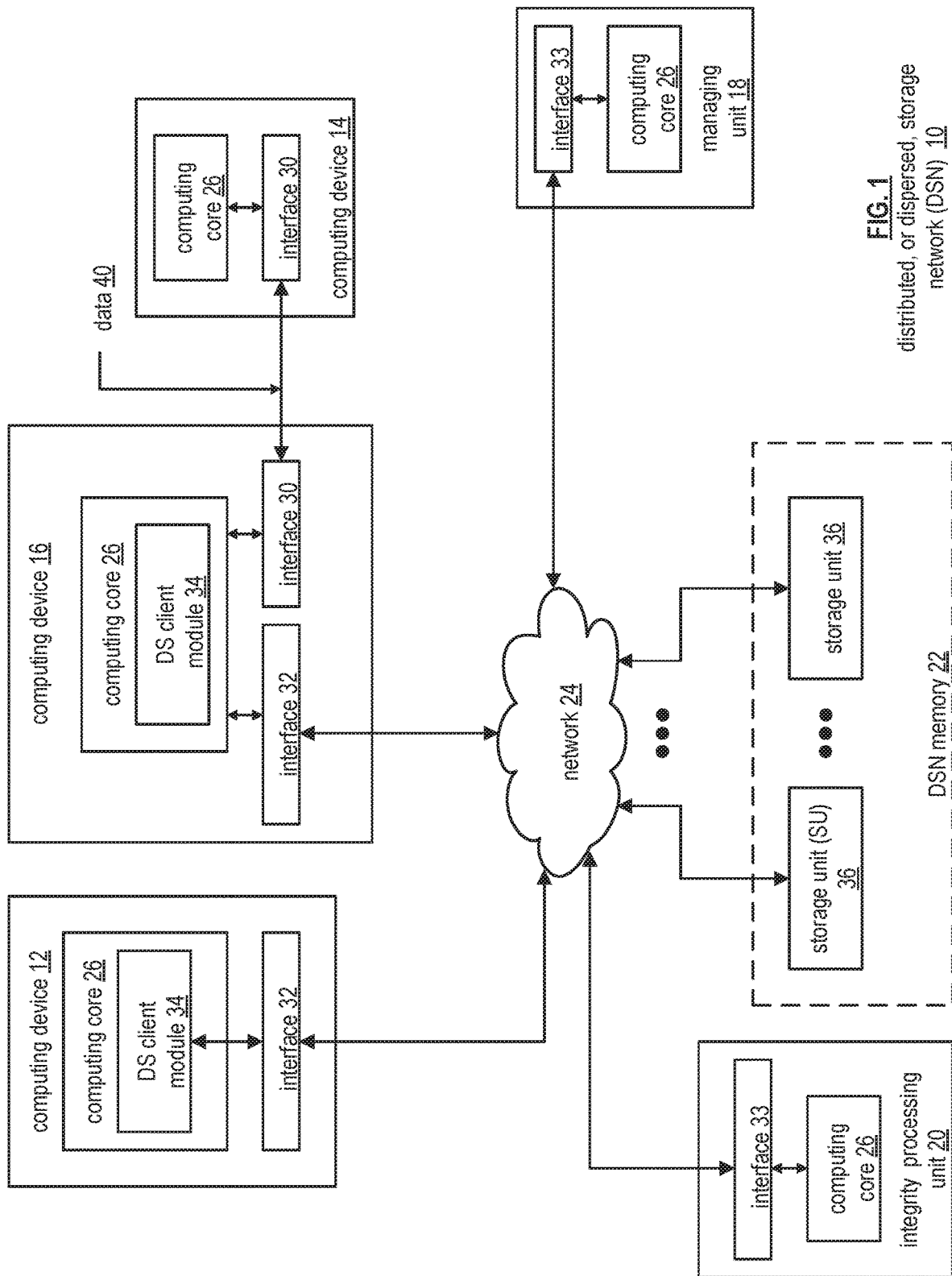
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
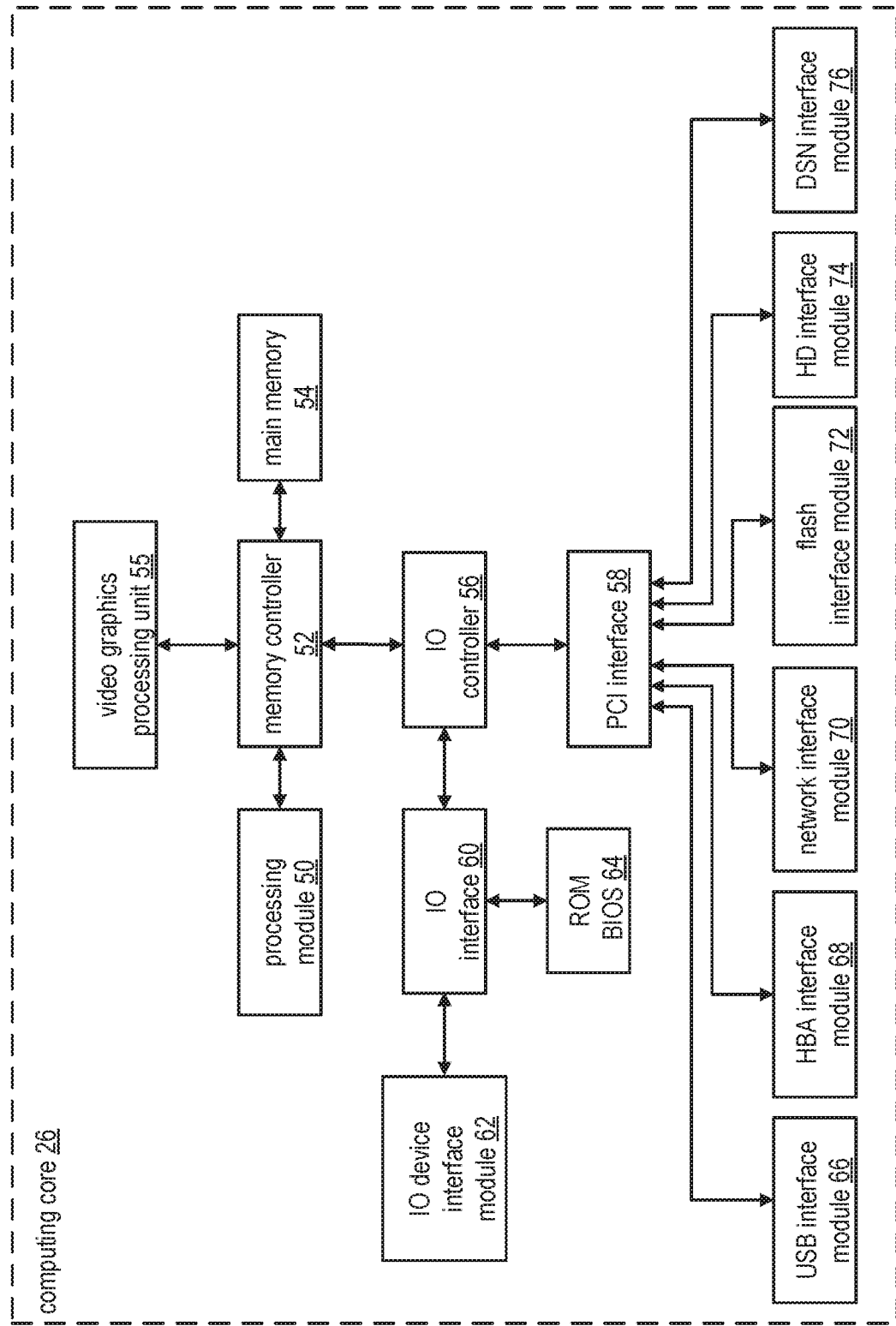
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN module 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSN managing unit 18 tracks the number of times a user accesses a non-public vault and/or public vaults, which can be used to generate a per-access billing information. In another instance, the DSN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity check-sum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3,1 a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 60 is shown in FIG. 6. As shown, the slice name (SN) 60 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
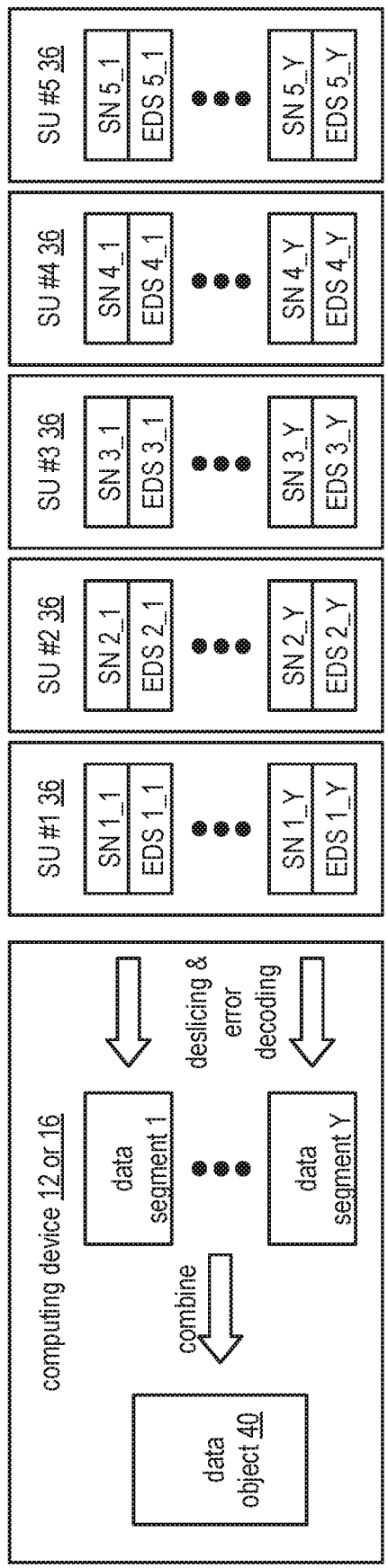
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
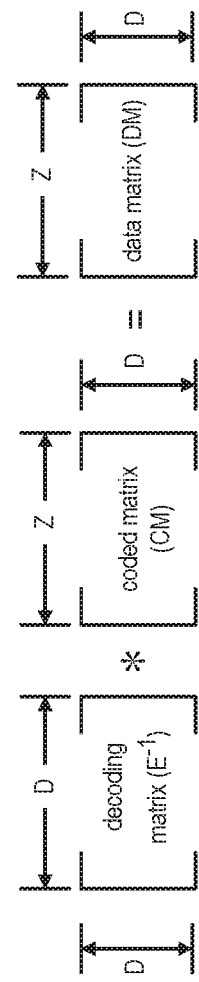
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

FIG. 9A is a diagram of an example 901 of the distributed computing system performing a distributed storage and task processing operation. The distributed computing system may be implemented to include a plurality of storage units (SUs) such as may include two or more storage units (SUs) 36-1 such as with respect to (which form at least a portion of DSN memory 22 such as with respect to FIG. 1). Each of the SUs 1-n (shown as SU 36-1 in FIG. 9A) includes a controller 86, a processing module 84, memory 88, a DT (distributed task) execution module 90, and a DS client module 34. The memory 88 is of sufficient size to store a significant number of encoded data slices (EDSs) (e.g., thousands of slices to hundreds-of-millions of slices) and may include one or more hard drives and/or one or more solid-state memory devices (e.g., flash memory, DRAM, etc.). Note that terms such as EDS or slice (or EDSs or slices) may be used interchangeably herein in various examples.

FIG. 9B is a schematic block diagram 902 of another embodiment of a dispersed or distributed storage network (DSN) that includes the computing device 16 of FIG. 1, the network 24 of FIG. 1, and a storage set. The DST processing unit 16 includes the DS client module 34 of FIG. 1 and a replication module 920. The replication module 920 may be implemented utilizing the processing module 84 such as described with respect to FIG. 9A and/or another processing module such as may be implemented within computing device 16 (or alternatively be a sub-component and/or sub-element of DS client module 34 and/or the computing device 16). The storage set includes a set of storage units (SUs) 1-n (e.g., shown as storage set 910). Each SU includes the processing module 84 the memory 88 such as described with respect to FIG. 9A. Each SU may be implemented utilizing the storage unit (SU) 36 of FIG. 1. Hereafter, each SU may be interchangeably referred to as a storage unit and the storage set may be interchangeably referred to as a set of storage units. The DSN functions to redundantly stored data.

In an example of operation of the redundant storing of the data, the DST processing unit 16 receives a store data object request, where the request includes one or more of a data object for storage, a data object name, and an instance count. For example, the DST processing unit 16 receives a store data object A request that includes a data object A, a data object name A, and an instance count=3. Having received the store data object request, the DST processing divides the received data object into a plurality of S data segments and dispersed storage error encodes each data segment to produce a plurality of S sets of EDSs.

Having produced the plurality of sets of EDSs, for each data object name, the DS client module 34 generates a corresponding plurality of sets of slice names for the plurality of sets of EDSs. For example, the DS client module 34 generates a random object number, combines the random object number with a vault identifier associated with the stored data object request to produce a source name, and generates S number of sets of slice names that includes one or more of the source name, a segment identifier (e.g., 1-S), and a slice index number (e.g., 1-n).

With the plurality of sets of slice names produced, the replication module 920 replicates the plurality of sets of EDSs based on the instance count to produce an instance count number of plurality of sets of replicated EDSs. For example, a first plurality of sets of EDSs includes a first set of EDSs that includes EDSs A1-1-1, A1-2-1, through A1-n-1 and a Sth set of EDSs includes EDSs A1-1-S, A1-2-S, through A1-n-S. As another example, a second plurality of sets of EDSs includes a first set of EDSs that includes EDSs A2-1-1, A2-2-1, through A2-n-1 and a Sth set of EDSs includes EDSs A2-1-S, A2-2-S, through A2-n-S. In yet another example, in all, the replication module 920 generates 3S sets of replicated EDSs 1-n when the instance count is 3.

With the EDSs replicated, the DST processing unit 16 facilitates storage of the replicated EDSs utilizing the corresponding plurality of sets of slice names. For example, the DST processing unit 16, for each storage unit of the set of storage units, generates a write slice request of a set of write slice request 1-n, where the write slice request includes an instant count number of replicated EDSs for each EDS corresponding to the storage unit for each set of EDSs, and sends, via the network 24, the generated read slice request to the storage unit. For example, the DST processing unit 16 issues a read slice request 1 to the SU 1, where the write slice request 1 includes EDS A1-1-1 and a slice name for EDS A1-1-1, EDS A2-1-1 and a slice name for EDS A2-1-1, EDS A3-1-1 and a slice name for EDS A3-1-1, etc., through EDS A1-1-S and a slice name for EDS A1-1-S, EDS A2-1-S and a slice name for EDS A2-1-S, EDS A3-1-S and a slice name for EDS A3-1-S.

In an example of operation and implementation, a computing device (e.g., the migration agent module 1530, computing device 12 or 16) includes an interface configured to interface and communicate with a dispersed or distributed storage network (DSN), a memory that stores operational instructions, and a processing module operably coupled to the interface and to the memory. The processing module, when operable within the computing device based on the operational instructions, is configured to perform various operations.

In an example, the computing device is configured to receive a request to store a data object. The computing device is also configured to dispersed error encode the data object to generate a plurality of sets of encoded data slices (EDSs). Note that the data object is segmented into a plurality of data segments, and a data segment of the plurality of data segments is dispersed error encoded in accordance with dispersed error encoding parameters to produce a set of EDSs of the plurality of sets of EDSs. The computing device is also configured to perform a deterministic function on a data object name associated with the data object to generate a plurality of data object names. The computing device is also configured to replicate the plurality of sets of EDSs to generate other pluralities of sets of EDSs. The computing device is also configured to facilitate storage of the plurality of sets of EDSs and the other pluralities of sets of EDSs within a plurality of storage units (SUs) within the DSN in accordance with the plurality of data object names.

In some examples, note that the request to store the data object includes one or more of the deterministic function, the data object name associated with the data object, the plurality of data object names associated with a plurality of data objects including the data object name associated with the data object, a store object data request, a plurality of store object data requests, an instance count, an instruction to generate the instance count, and/or an instruction to permute the data object name associated with the data object the instance count number of times to generate the plurality of data object names.

In certain examples of operation and implementation, the computing device is also configured to process the request to store the data object to determine an instance count included within the request to store the data object.

In some examples, the computing device is also configured to perform one or more other operations. For example, the computing device may be configured to perform the deterministic function on the data object name associated with the data object to generate an instance count number of data object names when generating the plurality of data object names. The computing device may also be configured to replicate the plurality of sets of EDSs to generate the instance count number of the other pluralities of sets of EDSs when generating the other pluralities of sets of EDSs. The computing device may also be configured to facilitate the storage of the plurality of sets of EDSs and the other pluralities of sets of EDSs within a plurality of SUs within the DSN based on a plurality of write requests or a write fanout request provided to the plurality of SUs. Note that the write fanout request may be implemented to include one or more parameters to be used by at least one SU of the plurality of SUs to perform a write fanout operation. Examples of the parameters specified within the write fanout request regarding the write fanout operation may include any one or more of an EDS for storage, a slice name of an EDS, a plurality of slice names of a plurality of EDSs, a slice revision number, and/or a fanout count that specifies a total replicate number of EDSs to be generated and stored.

Also, in some other examples, the computing device is configured to generate at least a write threshold number of EDSs for at least one set of EDSs within at least one of the plurality of sets of EDSs or at least one of the other pluralities of sets of EDSs to be stored within the DSN. Note that the write threshold number of EDSs provides for a successful transfer of the set of EDSs from a first at least one location in the DSN to a second at least one location in the DSN.

For example, in some instances, note that the set of EDSs is of pillar width, and the set of EDSs are distributedly stored among the plurality of SUs. Also, note that a decode threshold number of EDSs are needed to recover the data segment, and a read threshold number of EDSs provides for reconstruction of the data segment. Also, a write threshold number of EDSs provides for a successful transfer of the set of EDSs from a first at least one location in the DSN to a second at least one location in the DSN.

Note that the computing device may be located at a first premises that is remotely located from at least one SU of a plurality of SUs within the DSN. Also, note that the computing device may be of any of a variety of types of devices as described herein and/or their equivalents including a SU of any group and/or set of SUs within the DSN, a wireless smart phone, a laptop, a tablet, a personal computers (PC), a work station, and/or a video game device. Note also that the DSN may be implemented to include or be based on any of a number of different types of communication systems including a wireless communication system, a wire lined communication systems, a non-public intranet system, a public internet system, a local area network (LAN), and/or a wide area network (WAN).

FIG. 10A is a flowchart illustrating another example of redundantly storing data. The method 1001 begins or continues at a step 1010 where a processing module (e.g., of a distributed storage and task (DST) processing unit) receives a store data object request. The method 1001 continues at the step 1020 where the processing module dispersed storage error encodes a data object of the received store data object request to produce a plurality of sets of encoded data slices (EDSs).

The method 1001 continues at the step 1030 where the processing module performs a deterministic function on a received data object name and an instance count to produce an instance count number of data object names. The deterministic function may include one or more of a hashing function, a hash-based message authentication code function, a sponge function, and a mask generating function. For example, the processing module selects the deterministic function, performs the selected deterministic function on the received data object name and the instance count to produce the instance count number of data object names.

For each data object name, the method 1001 continues at the step 1040 where the processing module generates a corresponding plurality of sets of slice names for the plurality of sets of EDSs. For example, the processing module generates a random object number, combines the random object number with a vault identifier to produce a source name, and generates S sets of slice names in accordance with a number of segments S of the data object.

The method 1001 continues at the step 1050 where the processing module replicates the plurality of sets of EDSs based on the instance count to produce an instance count number of plurality of sets of replicated EDSs. The method 1001 continues at the step 1060 where the processing module facilitates storage of the replicated EDSs utilizing the corresponding plurality of sets of slice names. For example, for each storage unit of a set of storage units, the processing module generates a write slice request that includes an instance count number of replicated EDSs for each EDS corresponding to the storage unit for each set of EDSs, and sends the generated write slice requests to the storage unit.

FIG. 10B is a diagram illustrating an embodiment of a method 1002 for execution by one or more computing devices in accordance with the present invention. The method 1002 begins or continues in step 1011 by receiving (e.g., via an interface of the computing device that is configured to interface and communicate with a dispersed or distributed storage network (DSN)) a request to store a data object. The method 1002 then continues in step 1021 by dispersed error encoding the data object to generate a plurality of sets of encoded data slices (EDSs). Note that the data object is segmented into a plurality of data segments, and a data segment of the plurality of data segments is dispersed error encoded in accordance with dispersed error encoding parameters to produce a set of EDSs of the plurality of sets of EDSs.

The method 1002 then operates in step 1021 by performing a deterministic function on a data object name associated with the data object to generate a plurality of data object names. The method 1002 then operates in step 1041 by replicating the plurality of sets of EDSs to generate other pluralities of sets of EDSs. The method 1002 then operates in step 1051 by facilitating storage of the plurality of sets of EDSs and the other pluralities of sets of EDSs within a plurality of storage units (SUs) within the DSN in accordance with the plurality of data object names. In some examples, this may involve transmitting the plurality of sets of EDSs and the other pluralities of sets of EDSs to the plurality of SUs for storage therein within the DSN.

In some variants of the method 1002, note that the request to store the data object includes any one or more of the deterministic function, the data object name associated with the data object, the plurality of data object names associated with a plurality of data objects including the data object name associated with the data object, a store object data request, a plurality of store object data requests, an instance count, an instruction to generate the instance count, and/or an instruction to permute the data object name associated with the data object the instance count number of times to generate the plurality of data object names.

Also, in some other examples, such variants of the method 1002 operate by processing the request to store the data object to determine an instance count included within the request to store the data object. In addition, such variants of the method 1002 may also operate by performing one or more other operations. For example, such alternative variants of the method 1002 may also operate by performing the deterministic function on the data object name associated with the data object to generate an instance count number of data object names when generating the plurality of data object names. Such alternative variants of the method 1002 may also operate by replicating the plurality of sets of EDSs to generate the instance count number of the other pluralities of sets of EDSs when generating the other pluralities of sets of EDSs. In addition, such alternative variants of the method 1002 may also operate by facilitating the storage of the plurality of sets of EDSs and the other pluralities of sets of EDSs within a plurality of SUs within the DSN based on a plurality of write requests or a write fanout request provided to the plurality of SUs. Note that the write fanout request includes parameters to be used by at least one SU of the plurality of SUs to perform a write fanout operation. Also, note that the parameters specified within the write fanout request regarding the write fanout operation may include any one or more of an EDS for storage, a slice name of an EDS, a plurality of slice names of a plurality of EDSs, a slice revision number, and/or a fanout count that specifies a total replicate number of EDSs to be generated and stored.

In even other examples, alternative variants of the method 1002 operate by generating at least a write threshold number of EDSs for at least one set of EDSs within at least one of the plurality of sets of EDSs or at least one of the other pluralities of sets of EDSs to be stored within the DSN. Note that the write threshold number of EDSs provides for a successful transfer of the set of EDSs from a first at least one location in the DSN to a second at least one location in the DSN.

For example, in some instances, note that the set of EDSs is of pillar width, and the set of EDSs are distributedly stored among the plurality of SUs. Also, note that a decode threshold number of EDSs are needed to recover the data segment, and a read threshold number of EDSs provides for reconstruction of the data segment. Also, a write threshold number of EDSs provides for a successful transfer of the set of EDSs from a first at least one location in the DSN to a second at least one location in the DSN.

This disclosure presents, among other things, various examples of redundant storage systems that may operate to perform redundant storing of data. In an example of operation and implementation, a requester (e.g., a user, another computing device, etc.) that is making a request to store an object or other piece of content to a computing device may wish to create multiple instances of that content (for reliability reasons, for performance reasons, for legal reasons, or otherwise). However, in some examples, write requests may be inefficient in doing this, as the same content must be repeated over and over again for each instance to be created. To overcome this, the computing device, upon processing a write of some content, may operate by accepting additionally an "instance count" or a set of "object/file names".

In some examples, while processing the write operation, the computing device will receive only a single instance of the content from the requester, but the computing device will then expand it via either the provided instance count or the set of names by performing one or more of various operations, functions, etc. For an example of operation, the computing device may perform the following steps:

1. The computing device uses the provided object name (if provided) or otherwise chooses an initial object name
2. If the computing device was provided a set of names, it skips step 3 and goes to step 4
3. The computing device was given 1 or 0 names), if given 0 names it will generate 1 name. Next, with either the provided or generated name it will permute that name instance-count times to produce a set of names
4. The computing device computes slices for the received content (as an optimization it need only do this once), it then uses the set of object names to produce a corresponding set of slice names where the number of slices and slice names is a width times greater than the size of the set of object names
5. The computing device forms WriteRequests (or in some cases, may even form SliceFanoutWriteRequests, containing the slice names and the appropriate slice content for the particular slice name used
6. The computing device sends the requests to storage units (SUs) to be written according to normal write logic employed by the computing device
7. The computing device determines success or failure for the operation based on responses from the SUs
8. The computing device returns a success or failure indicator to the requester (and optionally the set of generated/permuted names in the case names were generated by the computing device).

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A computing device comprising:
an interface configured to interface and communicate with a dispersed or distributed storage network (DSN);
memory that stores operational instructions; and
a processing module operably coupled to the interface and to the memory, wherein the processing module, when operable within the computing device based on the operational instructions, is configured to:
receive a request to store a data object;
dispersed error encode the data object to generate a plurality of sets of encoded data slices (EDSs), wherein the data object is segmented into a plurality of data segments, wherein a data segment of the plurality of data segments is dispersed error encoded in accordance with dispersed error encoding parameters to produce a set of EDSs of the plurality of sets of EDSs;
perform a deterministic function on a data object name associated with the data object to generate a plurality of data object names;
replicate the plurality of sets of EDSs to generate other pluralities of sets of EDSs; and
facilitate storage of the plurality of sets of EDSs and the other pluralities of sets of EDSs within a plurality of storage units (SUs) within the DSN in accordance with the plurality of data object names.

2. The computing device of claim 1, wherein the request to store the data object includes at least one of the deterministic function, the data object name associated with the data object, the plurality of data object names associated with a plurality of data objects including the data object name associated with the data object, a store object data request, a plurality of store object data requests, an instance count, an instruction to generate the instance count, or an instruction to permute the data object name associated with the data object the instance count number of times to generate the plurality of data object names.

3. The computing device of claim 1, wherein the processing module, when operable within the computing device based on the operational instructions, is further configured to:
process the request to store the data object to determine an instance count included within the request to store the data object; and at least one of:
perform the deterministic function on the data object name associated with the data object to generate an instance count number of data object names when generating the plurality of data object names;
replicate the plurality of sets of EDSs to generate the instance count number of the other pluralities of sets of EDSs when generating the other pluralities of sets of EDSs; or facilitate the storage of the plurality of sets of EDSs and the other pluralities of sets of EDSs within a plurality of SUs within the DSN based on a plurality of write requests or a write fanout request provided to the plurality of SUs, wherein the write fanout request includes parameters to be used by at least one SU of the plurality of SUs to perform a write fanout operation, wherein the parameters specified within the write fanout request regarding the write fanout operation including at least one of an EDS for storage, a slice name of an EDS, a plurality of slice names of a plurality of EDSs, a slice revision number, or a fanout count that specifies a total replicate number of EDSs to be generated and stored.

4. The computing device of claim 1, wherein the processing module, when operable within the computing device based on the operational instructions, is further configured to:
generate at least a write threshold number of EDSs for at least one set of EDSs within at least one of the plurality of sets of EDSs or at least one of the other pluralities of sets of EDSs to be stored within the DSN, wherein the write threshold number of EDSs provides for a successful transfer of the set of EDSs from a first at least one location in the DSN to a second at least one location in the DSN.

5. The computing device of claim 1, wherein:
the set of EDSs is of pillar width;
the set of EDSs are distributedly stored among the plurality of SUs;
a decode threshold number of EDSs are needed to recover the data segment;
a read threshold number of EDSs provides for reconstruction of the data segment; and
a write threshold number of EDSs provides for a successful transfer of the set of EDSs from a first at least one location in the DSN to a second at least one location in the DSN.

6. The computing device of claim 1, wherein the computing device is located at a first premises that is remotely located from at least one SU of the plurality of SUs within the DSN.

7. The computing device of claim 1 further comprising:
a SU of the plurality of SUs within the DSN, a wireless smart phone, a laptop, a tablet, a personal computers (PC), a work station, or a video game device.

8. The computing device of claim 1, wherein the DSN includes at least one of a wireless communication system, a wire lined communication systems, a non-public intranet system, a public internet system, a local area network (LAN), or a wide area network (WAN).

9. A computing device comprising:
an interface configured to interface and communicate with a dispersed or distributed storage network (DSN);
memory that stores operational instructions; and
a processing module operably coupled to the interface and to the memory, wherein the processing module, when operable within the computing device based on the operational instructions, is configured to:
receive a request to store a data object, wherein the request to store the data object includes at least one of a deterministic function, a data object name associated with the data object, a plurality of data object names associated with a plurality of data objects including the data object name associated with the data object, a store object data request, a plurality of store object data requests, an instance count, an instruction to generate the instance count, or an instruction to permute the data object name associated with the data object the instance count number of times to generate the plurality of data object names;
dispersed error encode the data object to generate a plurality of sets of encoded data slices (EDSs), wherein the data object is segmented into a plurality of data segments, wherein a data segment of the plurality of data segments is dispersed error encoded in accordance with dispersed error encoding parameters to produce a set of EDSs of the plurality of sets of EDSs;

perform the deterministic function on the data object name associated with the data object to generate the plurality of data object names;

replicate the plurality of sets of EDSs to generate other pluralities of sets of EDSs including to generate at least a write threshold number of EDSs for at least one set of EDSs within at least one of the plurality of sets of EDSs or at least one of the other pluralities of sets of EDSs to be stored within the DSN, wherein the write threshold number of EDSs provides for a successful transfer of the set of EDSs from a first at least one location in the DSN to a second at least one location in the DSN; and facilitate storage of the plurality of sets of EDSs and the other pluralities of sets of EDSs within a plurality of storage units (SUs) within the DSN in accordance with the plurality of data object names.

10. The computing device of claim 9, wherein the processing module, when operable within the computing device based on the operational instructions, is further configured to:

process the request to store the data object to determine an instance count included within the request to store the data object; and at least one of:

perform the deterministic function on the data object name associated with the data object to generate an instance count number of data object names when generating the plurality of data object names;

replicate the plurality of sets of EDSs to generate the instance count number of the other pluralities of sets of EDSs when generating the other pluralities of sets of EDSs; or facilitate the storage of the plurality of sets of EDSs and the other pluralities of sets of EDSs within a plurality of SUs within the DSN based on a plurality of write requests or a write fanout request provided to the plurality of SUs, wherein the write fanout request includes parameters to be used by at least one SU of the plurality of SUs to perform a write fanout operation, wherein the parameters specified within the write fanout request regarding the write fanout operation including at least one of an EDS for storage, a slice name of an EDS, a plurality of slice names of a plurality of EDSs, a slice revision number, or a fanout count that specifies a total replicate number of EDSs to be generated and stored.

11. The computing device of claim 9, wherein:
the set of EDSs is of pillar width;
the set of EDSs are distributedly stored among the plurality of SUs;
a decode threshold number of EDSs are needed to recover the data segment;
a read threshold number of EDSs provides for reconstruction of the data segment; and
a write threshold number of EDSs provides for a successful transfer of the set of EDSs from a first at least one location in the DSN to a second at least one location in the DSN.

12. The computing device of claim 9 further comprising:
a SU of the plurality of SUs within the DSN, a wireless smart phone, a laptop, a tablet, a personal computers (PC), a work station, or a video game device.

13. The computing device of claim 9, wherein the DSN includes at least one of a wireless communication system, a wire lined communication systems, a non-public intranet system, a public internet system, a local area network (LAN), or a wide area network (WAN).

14. A method for execution by a computing device, the method comprising:

receiving, via an interface of the computing device that is configured to interface and communicate with a dispersed or distributed storage network (DSN), a request to store a data object;

dispersed error encoding the data object to generate a plurality of sets of encoded data slices (EDSs), wherein the data object is segmented into a plurality of data segments, wherein a data segment of the plurality of data segments is dispersed error encoded in accordance with dispersed error encoding parameters to produce a set of EDSs of the plurality of sets of EDSs;

performing a deterministic function on a data object name associated with the data object to generate a plurality of data object names;

replicating the plurality of sets of EDSs to generate other pluralities of sets of EDSs; and facilitating storage of the plurality of sets of EDSs and the other pluralities of sets of EDSs within a plurality of storage units (SUs) within the DSN in accordance with the plurality of data object names.

15. The method of claim 14, wherein the request to store the data object includes at least one of the deterministic function, the data object name associated with the data object, the plurality of data object names associated with a plurality of data objects including the data object name associated with the data object, a store object data request, a plurality of store object data requests, an instance count, an instruction to generate the instance count, or an instruction to permute the data object name associated with the data object the instance count number of times to generate the plurality of data object names.

16. The method of claim 14 further comprising:
processing the request to store the data object to determine an instance count included within the request to store the data object; and at least one of:

performing the deterministic function on the data object name associated with the data object to generate an instance count number of data object names when generating the plurality of data object names;

replicating the plurality of sets of EDSs to generate the instance count number of the other pluralities of sets of EDSs when generating the other pluralities of sets of EDSs; or facilitating the storage of the plurality of sets of EDSs and the other pluralities of sets of EDSs within a plurality of SUs within the DSN based on a plurality of write requests or a write fanout request provided to the plurality of SUs, wherein the write fanout request includes parameters to be used by at least one SU of the plurality of SUs to perform a write fanout operation, wherein the parameters specified within the write fanout request regarding the write fanout operation including at least one of an EDS for storage, a slice name of an EDS, a plurality of slice names of a plurality of EDSs, a slice revision number, or a fanout count that specifies a total replicate number of EDSs to be generated and stored.

17. The method of claim 14 further comprising:
generating at least a write threshold number of EDSs for at least one set of EDSs within at least one of the plurality of sets of EDSs or at least one of the other pluralities of sets of EDSs to be stored within the DSN, wherein the write threshold number of EDSs provides for a successful transfer of the set of EDSs from a first at least one location in the DSN to a second at least one location in the DSN.

18. The method of claim 14, wherein:
the set of EDSs is of pillar width;
the set of EDSs are distributedly stored among the plurality of SUs;
a decode threshold number of EDSs are needed to recover the data segment;
a read threshold number of EDSs provides for reconstruction of the data segment; and
a write threshold number of EDSs provides for a successful transfer of the set of EDSs from a first at least one location in the DSN to a second at least one location in the DSN.

19. The method of claim 14, wherein the computing device includes a SU of the plurality of SUs within the DSN, a wireless smart phone, a laptop, a tablet, a personal computers (PC), a work station, or a video game device.

20. The method of claim 14, wherein the DSN includes at least one of a wireless communication system, a wire lined communication systems, a non-public intranet system, a public internet system, a local area network (LAN), or a wide area network (WAN).

* * * * *